United States Patent [19]

Gillery

[11] 4,113,599

[45] Sep. 12, 1978

[54] SPUTTERING TECHNIQUE FOR THE DEPOSITION OF INDIUM OXIDE

[75] Inventor: F. Howard Gillery, Allison Park, Pa.

[73] Assignee: PPG Industries, Inc., Pittsburgh, Pa.

[21] Appl. No.: 836,269

[22] Filed: Sep. 26, 1977

[51] Int. Cl.$^2$ .............................................. C23C 15/00
[52] U.S. Cl. .............................. 204/192 P; 204/192 C
[58] Field of Search ......................... 204/192 P, 192 C

[56] References Cited

U.S. PATENT DOCUMENTS

| | | | |
|---|---|---|---|
| 3,907,660 | 9/1975 | Gillery | 204/192 P |
| 4,043,889 | 8/1977 | Kochel | 204/192 R |

OTHER PUBLICATIONS

"Physics of Thin Films," G. Hass et al., editors, Academic Press, 1977, vol. 9, pp. 49–71.

*Primary Examiner*—John H. Mack
*Assistant Examiner*—William Leader
*Attorney, Agent, or Firm*—Donna L. Seidel

[57] ABSTRACT

Consistent properties for indium oxide films deposited by cathode sputtering over a wide range of outgassing conditions are obtained by adjusting the flow rate of oxygen to maintain a constant discharge current while adjusting the flow rate of argon to maintain a constant pressure in the sputtering chamber.

6 Claims, No Drawings

SPUTTERING TECHNIQUE FOR THE DEPOSITION OF INDIUM OXIDE

BACKGROUND OF THE INVENTION

1. Field of the Invention.

This invention relates generally to the art of coating glass and more particularly to the art of depositing transparent, electroconductive coatings such as indium oxide by cathode sputtering.

2. The Prior Art

U.S. Pat. No. 3,907,660 to Gillery describes a method for cathode sputtering electroconductive films in a low pressure atmosphere of oxygen and an inert gas, preferably argon, in which the oxygen content of the mixture of gases is controlled within limits determined by the substrate temperature developed during the cathode sputtering operation. The partial pressure of oxygen in the low pressure atmosphere of the sputtering chamber is initially relatively high as the cathode sputtering begins and is reduced as the temperature of the substrate increases. During coating, the resistance of the deposited film is monitored continually. The oxygen concentration is varied to maintain a controlled rate of decrease in resistance of the deposited film. The above method relies heavily on the skill of the operator since too much oxygen can retard the rate of decrease in resistance while too little oxygen can result in an opaque metallic film.

SUMMARY OF THE PRESENT INVENTION

The present invention provides a better system for controlling the deposition of indium and/or tin oxide films by cathode sputtering. In a typical cathode sputtering operation, after pump-down is started to evacuate the coating chamber, heaters are energized to preheat the substrate. When the pressure has been reduced to about $5 \times 10^{-5}$ torr, the chamber is backfilled with gas to a pressure of about $3 \times 10^{-2}$ torr. The incoming gas is a mixture of argon and oxygen. A copper cathode, faced with indium and/or tin, is presputtered for about a minute before the substrate is coated. Typical operating power is about 5-15 kilowatts at 3000-4000 volts.

The method of the present invention involves controlling the deposition of indium and/or tin oxide by cathode sputtering by maintaining a constant discharge current at a constant pressure. Since the voltage and temperature remain relatively constant during the coating process, the discharge current is primarily affected by the gas composition and pressure in the chamber. For a particular argon-oxygen ratio, the current is higher at higher total gas pressure. Similarly, for a given pressure, the current is higher at higher oxygen concentrations in the gas mixture. Unfortunately, the gas composition is the most difficult aspect of the cathode sputtering operation to control. The difficulty in controlling the gas composition in the chamber results from outgassing; i.e., the evolution of gas, especially water vapor, from the surfaces within the evacuated chamber. Although the surface to volume ratio in a large system is low, the gas composition is significantly affected by outgassing from numerous mild steel parts in a typical sputtering chamber. Such parts outgas readily as soon as sputtering begins and continue to outgas at steadily decreasing rates until the sputtering is completed. While the effects of outgassing may be reduced by maintaining a hot chamber, by using high gas flow rates and pumping rates, by minimizing open time of the chamber, and by operating in a dry, air-conditioned room, these measures are insufficient to eliminate the undesirable effects of outgassing.

The present invention provides a technique for controlling the deposition of indium and/or tin oxide by cathode sputtering. This technique compensates for the effect of outgassing upon the gas composition in the coating chamber. The gas evolved by outgassing is mostly water vapor which is an effective oxidant. Since the oxidative capacity of the atmosphere in the sputtering chamber must be closely controlled to obtain optimum conductivity of the film, the method of the present invention provides for monitoring the discharge current and maintaining it at a constant value by increasing the oxygen content of the incoming gas mixture as the rate of outgassing decreases. This method of controlling the deposition of a metal oxide film by maintaining a constant oxidative level in the sputtering chamber atmosphere results in a constant specific resistivity of the film throughout its thickness. The method of the present invention provides for simultaneously adjusting the argon flow rate to maintain a constant total gas pressure in the system.

DETAILED DESCRIPTION OF THE PREFERRED EMBODIMENTS

The preferred substrates to be coated are plates or sheets of soda-lime-silica glass. Although other substrates may also be coated in accordance with this invention, the size and shape of a substrate to be coated is limited by the size of the vacuum chamber and the size and mode (stationary or scanning) of the cathode. In a preferred large scale embodiment of the present invention, the vacuum chamber is 5 feet (1.5 meters) in diameter and 8 feet (2.4 meters) in length, and a scanning cathode 6 inches by 50 inches (15 centimeters by 127 centimeters) is employed.

A 4 foot by 6 foot (1.2 meters by 1.8 meters) flat glass sheet is cleaned with 50 percent n-propanol in water. Blocking with cerium oxide slurry may be necessary if the surface is badly stained. The glass substrate is placed horizontally in the chamber which is then evacuated to less than about $10^{-1}$ torr, preferably less than $10^{-2}$ torr, if the system is to be flushed, or to less than about $10^{-4}$ torr, preferably about $5 \times 10^{-5}$ torr, if the system is to be backfilled without flushing. The evacuated chamber is then backfilled to a pressure between about 0.5 and 10 $\times 10^{-2}$ torr, preferably about $3 \times 10^{-2}$ torr, with a mixture of argon and oxygen, preferably up to about 30 percent by volume oxygen. When the sputtered metal is indium or a predominantly indium alloy, the oxygen content is in the lower portion of the range, preferably 0.5 to 5 percent. When the sputtered metal is tin or a predominantly tin alloy, the oxygen content is much higher, typically in the range of 10 to 30 percent. Argon is preferred in most sputtering operations because of its high mass and low cost. Krypton and xenon can also be used and are more efficient for sputtering but are also considerably more expensive.

While the chamber is being evacuated and the sputtering atmosphere is being established, the substrate is heated by electrical resistance wire heaters, preferably nichrome wires. About 24 such wires are preferably disposed in parallel relation at 2 inch (5 centimeters) spacing about 2 to 4 inches (5 to 10 centimeters) from the surface of the substrate opposite the surface to be coated. Low voltage and high current are used to prevent arcing. Elevated substrate temperatures are advantageous to the sputter coating process because higher deposition rates are possible since the reaction between the sputtered metal and oxygen to form the metal oxide is faster and also because the operating range between hazy coatings from too little oxygen and high resistance coatings from too much oxygen is broader. Preferably, a glass substrate is preheated to at least about 200° C., preferably at least 250° C., and most preferably about 300° C. before commencing the coating process. Heating must be fairly uniform to avoid breakage. As soon as sputtering begins, the glass heats rapidly. The maximum temperature is determined by the tolerance of the substrate.

While the substrate is being brought up to initial coating temperature, a gradually increasing voltage is applied to the cathode from a high voltage source, preferably about 3000–4000 volts D.C. The voltage is applied slowly since rapid application of high voltage causes arcing with possible damage to the power supply. The cathode is preferably a water-cooled copper cathode faced with a metal having an atomic number between 48 and 51, preferably tin and/or indium. A preferred metal composition for the target surface is an alloy of 90 percent indium and 10 percent tin. Typical operating power is about 5 to 15 kilowatts at about 3000–4000 volts. When the voltage on the cathode is sufficient for a glow discharge to begin, ionized gas atoms are attracted to the cathode by the applied potential. The exchange of momentum which takes place as the ions penetrate the target is primarily effected by the heavier argon ions; the oxygen in the system being for the oxidation of the metal film. The exchange of momentum at the cathode target surface results in the ejection of electrons and particles of the target material which travel away from the cathode. The electrons gain energy as a result of the electric field and at some point (the limit of the cathode dark space) have sufficient energy to ionize additional gas atoms. The metal is eventually deposited onto the surface of the substrate where it forms the oxide film.

A large glass substrate is preferably coated by scanning at a distance of about 2 inches with the sputtering cathode. Measurements of the film show a typical carrier density of about $10^{21}$ per cubic centimeters and a carrier mobility of about 30 centimeters square per volt second. During the coating operation, the deposited film is monitored continually. Two types of monitors are used in the coating chamber. The resistance is monitored by utilizing the bus bars generally present on the glass substrate to carry the heating current in the final product, typically an electrically heatable window. The other monitor measures optical transmission which indicates the thickness of the film enabling the operator to stop the coating operation at a transmission maximum. Preferably, the final coated substrate has a luminous transmittance of about 86 percent and a specific resistivity of about $2 \times 10^{-4}$ ohm-centimeter.

The specific resistivity of the film is maintained constant throughout the thickness of the film by the method of the present invention as follows. When the voltage applied to the cathode is sufficient for a glow discharge and the sputtering operation commences, outgassing of the surface within the evacuated chamber begins. The evolved gas is mostly water vapor which decomposes under the influence of the glow discharge. The hydrogen produced does not contribute substantially to the discharge current because it is difficult to ionize and does not significantly affect the sputtering process because of its low mass. However, the oxygen produced by the dissociation of water molecules, while also of too low mass to significantly affect the sputtering process, is effective to react with the sputtered metal to form a metal oxide film on the substrate and at the same time has a substantial effect on the discharge current because it is light and easily ionized.

The method of the present invention involves controlling the oxygen concentration in the system by monitoring the discharge current and total gas pressure and subsequently adjusting the oxygen flow rate and the inert gas flow rate in response to changes in the monitored values to maintain a constant discharge current and a constant gas pressure in the system, thus insuring the production of uniform metal oxide films with a constant specific resistivity.

In practice, a particular pressure and current are chosen at which a stable and reasonable deposition rate may be maintained. Most preferred are a pressure of about $2 \times 10^{-2}$ to $3.5 \times 10^{-2}$ torr and a current density between 1 and 4 milliamperes per square centimeter. The preferred current density corresponds to a current of about 1 to 5 amperes for a preferred large cathode and about 200 to 500 milliamperes for a small laboratory scale cathode. The initial oxygen content of the incoming gas mixture is low, preferably about 0.5 percent since the amount of oxygen contributed by water vapor from outgassing is initially high. As the rate of outgassing decreases, the oxygen depletion in the system will be indicated by a drop in the discharge current which is monitored continuously. The oxygen flow rate is then increased to maintain the discharge current at a constant value. The argon flow rate is simultaneously decreased to maintain a constant gas pressure in the system. Thus the method of the present invention insures uniform deposition of metal oxide by maintaining a uniform atmosphere in the sputtering chamber.

The present invention will be further understood from the description of a specific example which follows.

EXAMPLE I

In a small laboratory-scale vacuum chamber, glass substrates are placed 2 inches (5 centimeters) from a 5 inch (12.7 centimeters) square cathode faced with an alloy of 90 percent indium and 10 percent tin. The voltage is set at 4000 volts. The substrates are preheated to about 600° F. (about 315° C.). The gas flow rates are set so that the incoming gas mixture initially contains about 0.46 percent oxygen in argon at a total pressure of about $2.9 \times 10^{-2}$ torr. The discharge current under these conditions is about 300 milliamperes. During the sputtering process, the temperature of the glass substrates rises to about 830° F. (about 443° C.).

As the discharge current begins to drop, as a result of the decrease in oxygen concentration which results from the decreasing rate of outgassing, the oxygen flow rate is increased to keep the discharge current constant at its initial level while the argon flow rate is decreased to maintain the original pressure in the system. Over a period of about 2 hours, the oxygen flow rate is increased from an initial value of about 0.6 cubic centimeters per minute to about 2.8 cubic centimeters per minute to maintain the discharge current constant at about 300 milliamperes while the argon flow rate is decreased from an initial value of about 130 cubic centimeters per minute to about 82 cubic centimeters per minute to maintain the total gas pressure in the system constant at the initial value of about $2.9 \times 10^{-2}$ torr.

The result of the above method of controlling the atmosphere in the coating chamber is that all the samples coated during the period had essentially the same resistance.

The above example is offered to illustrate the present invention; however, the invention is not limited to this embodiment. A wide variety of pressures, currents, gas ratios, target materials and so on may be employed. In addition, the argon flow rate may be adjusted in response to a change in discharge current while the oxygen flow rate is adjusted in relation to pressure. The scope of the invention is defined by the following claims.

I claim:

1. A method for the controlled deposition of an oxide-containing film of a metal selected from the group consisting of metals having an atomic number from 48 to 51 and mixtures thereof, comprising the steps of
   a. evacuating a coating chamber to a pressure less than $10^{-1}$ torr;
   b. flowing through said chamber a gas mixture comprising oxygen and a chemically inert gas while maintaining a total pressure of less than $10^{-1}$ torr;
   c. heating a substrate selected from the group consisting of glass and other refractory materials to at least 200° C. in the evacuated chamber;
   d. applying sufficient voltage to a cathode, spaced from and in facing relation to said substrate and faced with the selected metal, to cause sputtering of the selected metal;
   e. monitoring the discharge current and gas pressure in the chamber during the course of sputtering;
   f. increasing the flow rate of oxygen and decreasing the flow rate of the chemically inert gas into the chamber as necessary in response to changes in said monitored discharge current and gas pressure to maintain a constant discharge current at a constant pressure.

2. The improved method according to claim 1, wherein the chemically inert gas is argon.

3. The improved method according to claim 2, wherein the selected metal is selected from the group consisting of tin, indium and mixtures thereof.

4. The improved method according to claim 3, wherein the selected metal is an alloy of 90 percent indium and 10 percent tin.

5. The improved method according to claim 1, wherein the current density is maintained at a constant value within the range of 1 to 4 milliamperes per square centimeter.

6. In a method for the deposition of an oxide containing film of a metal selected from the group consisting of metals having an atomic number from 48 to 51 and mixtures thereof onto a heated substrate selected from the group consisting of glass, ceramics and other refractory materials by cathode sputtering in an evacuated coating chamber through which a gas mixture containing at least about 0.5 percent oxygen and a chemically inert gas is flowed while maintaining a pressure of less than $10^{-1}$ torr the improvement which comprises:
   a. monitoring the discharge current and gas pressure in the chamber during the course of cathode sputtering;
   b. increasing the flow rate of oxygen and decreasing the flow rate of the chemically inert gas into the coating chamber as necessary in response to changes in said monitored discharge current and gas pressure to maintain a constant discharge current at a constant gas pressure.

* * * * *